(12) United States Patent
Engel et al.

(10) Patent No.: US 11,835,601 B2
(45) Date of Patent: Dec. 5, 2023

(54) MAGNETORESISTIVE MAGNETIC FIELD SENSOR BRIDGE WITH COMPENSATED CROSS-AXIS EFFECT

(71) Applicant: Robert Bosch GmbH, Stuttgart (DE)

(72) Inventors: Brad Engel, Chandler, AZ (US); Phillip Mather, Phoenix, AZ (US)

(73) Assignee: Robert Bosch GmbH, Stuttgart (DE)

( * ) Notice: Subject to any disclaimer, the term of this patent is extended or adjusted under 35 U.S.C. 154(b) by 579 days.

(21) Appl. No.: 16/956,167

(22) PCT Filed: Dec. 11, 2018

(86) PCT No.: PCT/EP2018/084398
§ 371 (c)(1),
(2) Date: Jun. 19, 2020

(87) PCT Pub. No.: WO2019/121174
PCT Pub. Date: Jun. 27, 2019

(65) Prior Publication Data
US 2020/0333408 A1    Oct. 22, 2020

Related U.S. Application Data

(60) Provisional application No. 62/608,658, filed on Dec. 21, 2017.

(51) Int. Cl.
*G01R 33/09* (2006.01)
*G01R 33/00* (2006.01)

(52) U.S. Cl.
CPC ....... *G01R 33/093* (2013.01); *G01R 33/0052* (2013.01); *G01R 33/096* (2013.01); *G01R 33/098* (2013.01)

(58) Field of Classification Search
CPC . G01R 33/0052; G01R 33/093; G01R 33/096
See application file for complete search history.

(56) References Cited

U.S. PATENT DOCUMENTS

| 8,390,283 B2 | 3/2013 | Mather et al. |
| 8,816,683 B2 | 8/2014 | Wang et al. |
| 2016/0320459 A1 | 11/2016 | Mather et al. |

FOREIGN PATENT DOCUMENTS

| EP | 1 720 027 A1 | 11/2006 | |
| EP | 3236276 A1 * | 10/2017 | ......... G01R 33/0011 |

OTHER PUBLICATIONS

International Search Report corresponding to International Patent Application No. PCT/EP2018/084398 dated Feb. 27, 2019 (3 pages).

* cited by examiner

*Primary Examiner* — Minh Q Phan
(74) *Attorney, Agent, or Firm* — Maginot, Moore & Beck LLP

(57) ABSTRACT

In one embodiment, a magnetoresistive (MR) magnetic field sensor system includes a MR magnetic field sensor bridge. The MF magnetic field sensor bridge includes a sense leg with a sense element with a first layer with a first fixed magnetization orientation and, a second layer with a first free magnetization orientation, the first free magnetization orientation orthogonal to the first fixed magnetization orientation at a zero applied magnetic field. A reference leg of the MF magnetic field sensor bridge is electronically connected in parallel to the sense leg. The reference leg includes at least one reference element with a third layer with a second fixed magnetization orientation parallel to, and in the same direction as, the first fixed magnetization orientation, and a fourth layer with a second free magnetization orientation, the second free magnetization orientation parallel to the first fixed magnetization orientation at the zero applied magnetic field.

18 Claims, 5 Drawing Sheets

MAGNETORESISTIVE MAGNETIC FIELD SENSOR BRIDGE WITH COMPENSATED CROSS-AXIS EFFECT

This application is a 35 U.S.C. § 371 National Stage Application of PCT/EP2018/084398, filed on Dec. 11, 2018, which claims priority to U.S. provisional patent application No. 62/608,658, filed on Dec. 21, 2017 the disclosures of which are incorporated herein by reference in their entirety.

FIELD

The disclosure relates to tunneling magnetoresistive (TMR) magnetic field sensors.

BACKGROUND

Known magnetoresistive (MR) magnetic field sensors are based on either Anisotropic Magnetoresistance (AMR), Giant Magnetoresistance (GMR), or Tunneling Magnetoresistance (TMR). One issue that all MR sensors must deal with is the cross-axis effect, defined as a field applied along the non-sensitive direction that changes the sensitivity due to the influence of the field on the magnetic anisotropy.

MR sensors are commonly combined in a single device with high sensitivity and 3 orthogonal axes for use as geomagnetic magnetometers in smart phones. In order to accurately determine the direction of the earth's magnetic field relative to the phone, the sensor must have an identical response in all orientations of the phone. Stray fields from magnetics and soft-iron materials in the phone are superimposed on the earth's field and must be eliminated by in situ calibration. This is difficult to do with high accuracy if the sensor has a high cross-axis effect.

It is therefore desirable to have a MR magnetic field sensor that has a linear response and reduced cross-axis effect. It would be further beneficial to have a MR magnetic field sensor that has no cross-axis effect.

SUMMARY

The present disclosure is directed to a magnetoresistive (MR) magnetic field sensor bridge that in one embodiment is a tunneling MR (TMR) magnetic field sensor bridge. The MR magnetic field sensor bridge provides high linearity and a fully compensated cross-axis effect. The benefit of this bridge device is its linearity and elimination of cross-axis effect for all MR levels including advanced materials with very high TMR, like MgO bathers. In contrast to previous devices, the sensitivity of the disclosed bridge is independent of external magnetic field, regardless of applied direction.

In one embodiment, a MR magnetic field sensor system includes a MR magnetic field sensor bridge. The MF magnetic field sensor bridge includes a sense leg with a sense element with a first layer with a first fixed magnetization orientation and, a second layer with a first free magnetization orientation, the first free magnetization orientation orthogonal to the first fixed magnetization orientation at a zero applied magnetic field. A reference leg of the MF magnetic field sensor bridge is electronically connected in parallel to the sense leg. The reference leg includes at least one reference element with a third layer with a second fixed magnetization orientation parallel to, and in the same direction as, the first fixed magnetization orientation, and a fourth layer with a second free magnetization orientation, the second free magnetization orientation parallel to the first fixed magnetization orientation at the zero applied magnetic field.

In one or more embodiments, the at least one sense element includes a first sense element and a second sense element. The first free magnetization orientation of the first sense element is opposite to the first free magnetization orientation of the second sense element at the zero applied magnetic field. Additionally, the at least one reference element includes a first reference element and a second reference element. The second free magnetization orientation of the first reference element is opposite to the second free magnetization orientation of the second reference element at the zero applied magnetic field.

In one or more embodiments, the at least one sense element includes a third sense element and a fourth sense element. The third sense element is electronically connected in series to the first sense element. The fourth sense element is electronically connected in series with the second sense element, The first free magnetization orientation of the third sense element is opposite to the first free magnetization orientation of the fourth sense element at the zero applied magnetic field, and the first free magnetization orientation of the third sense element is opposite to the first free magnetization orientation of the second sense element at the zero applied magnetic field. Additionally, the at least one reference element includes a third reference element and a fourth reference element. The third reference element is electronically connected in series with the first reference element. The fourth reference element is electronically connected in series with the second reference element. The second free magnetization orientation of the third reference element is opposite to the second free magnetization orientation of the fourth reference element at the zero applied magnetic field, and the second free magnetization orientation of the third reference element is opposite to the second free magnetization orientation of the second reference element at the zero applied magnetic field.

In one or more embodiments, the MR magnetic field sensor system includes a memory including program instructions stored therein, and a control unit operably connected to the at least one MR magnetic field sensor bridge and the memory, the control unit configured to execute the program instructions to determine a rotational orientation associated with the at least one MR magnetic field sensor bridge based upon input from the at least one MR magnetic field sensor bridge.

In one or more embodiments, the MR magnetic field sensor system includes a first MR magnetic field sensor bridge and a second MR magnetic field sensor bridge. IN this embodiment, the first fixed magnetization orientation of the first MR magnetic field sensor bridge is orthogonal to the first fixed magnetization orientation of the second MR magnetic field sensor bridge.

In one or more embodiments, the MR magnetic field sensor system includes a third MR magnetic field sensor bridge. In this embodiment, the first fixed magnetization orientation of the third MR magnetic field sensor bridge is orthogonal to the first fixed magnetization orientation of the first MR magnetic field sensor bridge, and the first fixed magnetization orientation of the third MR magnetic field sensor bridge is orthogonal to the first fixed magnetization orientation of the second MR magnetic field sensor bridge.

In one or more embodiments, the MR magnetic field sensor system includes a memory including program instructions stored therein. A control unit is operably connected to the first MR magnetic field sensor bridge, the second MR magnetic field sensor bridge, the third MR magnetic field sensor bridge, and the memory. The control unit is configured to execute the program instructions to determine a rotational orientation based upon input from the first MR magnetic field sensor bridge, the second MR magnetic field sensor bridge, and the third MR magnetic field sensor bridge.

In one or more embodiments the at least one MR magnetic field sensor bridge is a tunneling MR magnetic field sensor bridge.

In one or more embodiments the at least one MR magnetic field sensor bridge is an anisotropic MR magnetic field sensor bridge.

In one or more embodiments the at least one MR magnetic field sensor bridge is a giant MR magnetic field sensor bridge.

In one embodiment, a method of forming a magnetoresistive (MR) magnetic field sensor system, with at least one MR magnetic field sensor bridge, includes forming a sense leg of the at least one MR magnetic field sensor bridge, the sense leg including at least one sense element with a first layer with a first fixed magnetization orientation and a second layer with a first free magnetization orientation, the first free magnetization orientation orthogonal to the first fixed magnetization orientation at a zero applied magnetic field. The method further includes forming a reference leg of the at least one MR magnetic field sensor bridge, the reference leg including at least one reference element with a third layer with a second fixed magnetization orientation, and a fourth layer with a second free magnetization orientation. The formed sense and reference legs are positioned such that the second free magnetization orientation is parallel to the first fixed magnetization orientation at the zero applied magnetic field, and the second fixed magnetization orientation is parallel to, and in the same direction as, the first fixed magnetization orientation. The sense and reference legs are electronically connected in parallel.

In one or more embodiments, forming the sense leg includes forming the sense leg with a first sense element and a second sense element, and positioning the first sense element and the second sense element such that the first free magnetization orientation of the first sense element is opposite to the first free magnetization orientation of the second sense element at the zero applied magnetic field. Forming the reference leg includes forming the reference leg with a first reference element and a second reference element, and positioning the first reference element and the second reference element such that the second free magnetization orientation of the first reference element is opposite to the second free magnetization orientation of the second reference element at the zero applied magnetic field.

In one or more embodiments, forming the sense leg includes forming the sense leg with a third sense element and a fourth sense element, electronically connecting the third sense element in series with the first sense element, and electronically connecting the fourth sense element in series with the second sense element. The method includes positioning the third sense element such that the first free magnetization orientation of the third sense element is opposite to the first free magnetization orientation of the fourth sense element at the zero applied magnetic field, and such that the first free magnetization orientation of the third sense element is opposite to the first free magnetization orientation of the second sense element at the zero applied magnetic field. In this embodiment, forming the reference leg includes forming the reference leg with a third reference element and a fourth reference element, electronically connecting the third reference element in series with the first reference element, electronically connecting the fourth reference element in series with the second reference element, and positioning the third reference element such that the second free magnetization orientation of the third reference element is opposite to the second free magnetization orientation of the fourth reference element at the zero applied magnetic field, and such that the second free magnetization orientation of the third reference element is opposite to the second free magnetization orientation of the second reference element at the zero applied magnetic field.

In one or more embodiments the at least one MR magnetic field sensor bridge includes a first MR magnetic field sensor bridge and a second MR magnetic field sensor bridge. In such embodiments, the method further includes positioning the first MR magnetic field sensor bridge and the second MR magnetic field sensor bridge such that the first fixed magnetization orientation of the first MR magnetic field sensor bridge is orthogonal to the first fixed magnetization orientation of the second MR magnetic field sensor bridge.

In one or more embodiments the at least one MR magnetic field sensor bridge includes a third MR magnetic field sensor bridge. In such embodiments, the method further includes positioning the third MR magnetic field sensor bridge such that the first fixed magnetization orientation of the third MR magnetic field sensor bridge is orthogonal to the first fixed magnetization orientation of the first MR magnetic field sensor bridge, and orthogonal to the first fixed magnetization orientation of the second MR magnetic field sensor bridge.

In one or more embodiments, the method further includes storing program instructions within a memory, and operably connecting a control unit to the at least one MR magnetic field sensor bridge and the memory, the control unit configured to execute the program instructions to determine a rotational orientation associated with the at least one MR magnetic field sensor bridge based upon input from the at least one MR magnetic field sensor bridge.

In one or more embodiments, the method further includes storing program instructions in a memory, and operably connecting a control unit to the first MR magnetic field sensor bridge, the second MR magnetic field sensor bridge, the third MR magnetic field sensor bridge, and the memory, the control unit configured to execute the program instructions to determine a rotational orientation based upon input from the first MR magnetic field sensor bridge, the second MR magnetic field sensor bridge, and the third MR magnetic field sensor bridge.

BRIEF DESCRIPTION OF THE DRAWINGS

The foregoing aspects and other features are explained in the following description, taken in connection with the accompanying drawings.

DETAILED DESCRIPTION

Figure 1:
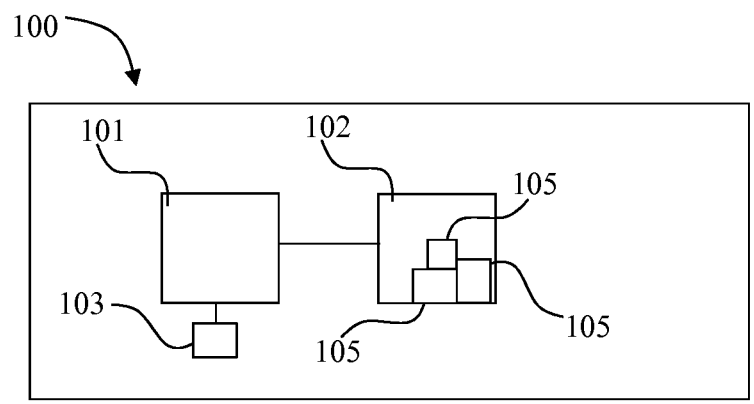
FIG. 1 depicts a schematic view of a smartphone which includes a TMR magnetic field sensor bridge.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

FIG. 1 depicts a smart phone 100 incorporating a control unit 101 operatively connected to a magnetoresistive (MR) magnetic field sensor 102 that provides high linearity and a fully compensated cross-axis effect. The control unit 101 is configured to execute program instructions stored in the control unit or a separate memory 103 to operate in a desired manner. The control unit 101 uses input from the MR magnetic field sensor 102 to determine rotational orientation of the smartphone 100.

Figure 2:
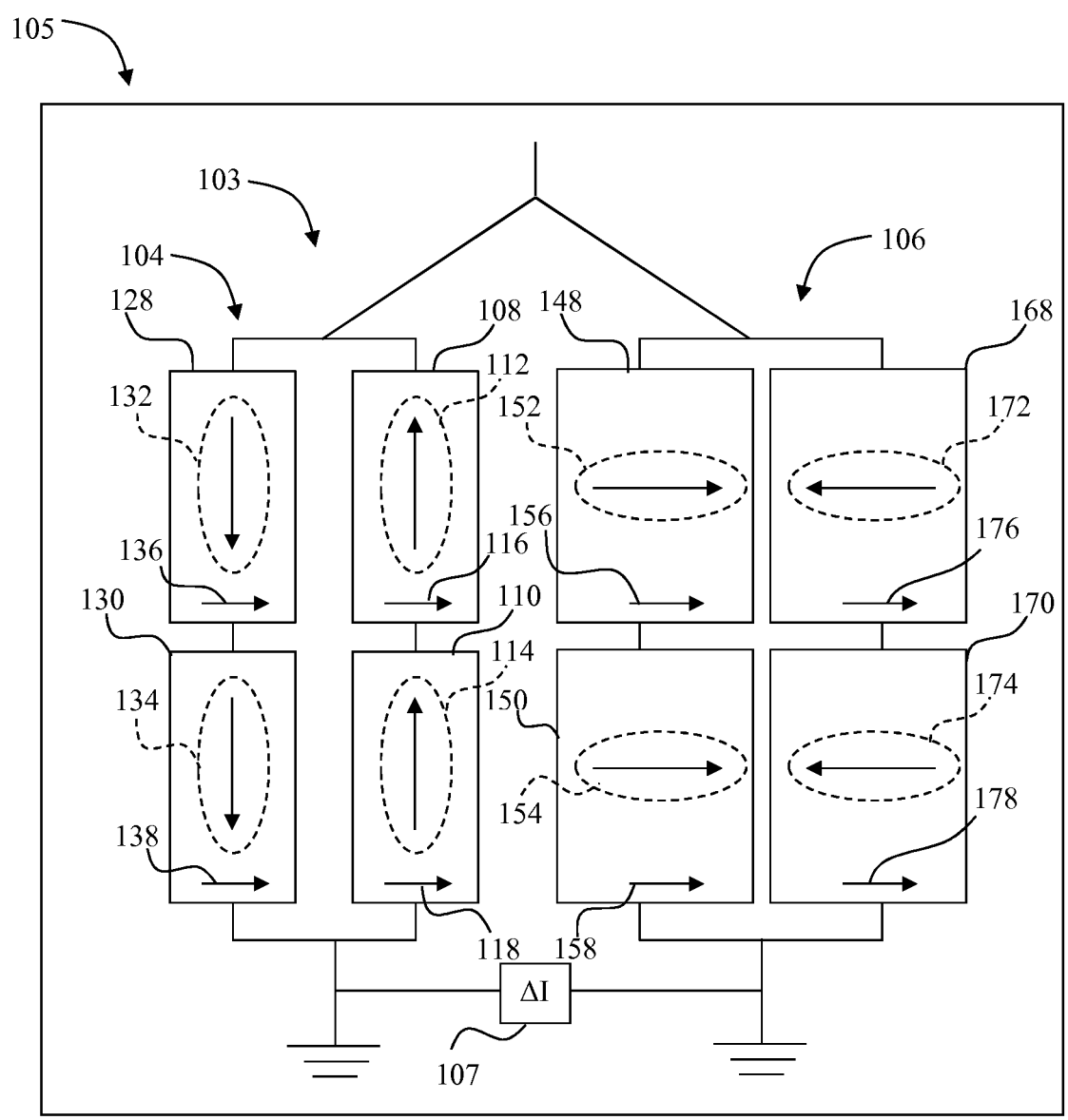
FIG. 2 depicts schematic view of the TMR magnetic field sensor bridge of FIG. 1.

The MR magnetic field sensor 102, which in some embodiments is included on a chip with other sensors (not shown), typically includes three MR magnetic field sensor bridges, each configured to sense a magnetic field along a respective axis wherein each of the axes is orthogonal to each of the other axes. One of the MR magnetic field sensor bridges is depicted in FIG. 2 in the form of a tunneling magnetoresistive (TMR) field sensor bridge 105 although other types of MR sensor bridges are used in other embodiments.

The TMR magnetic field sensor bridge 105 includes two legs 104/106 of TMR devices with each leg having different TMR element configurations. The sensor response is obtained in a differential current sensing circuit 107 between the two legs 104/106, the output of which is used in providing a signal from the MR magnetic field sensor 102 to the control unit 101. The control unit 101 executes the saved program instructions to ascertain the orientation of the smartphone 100 using the signal from the MR magnetic field sensor 102.

The leg 104 is the sensing side and responds to an applied magnetic field along a single axis with a linear change in conductance, and therefore current, through the TMR stack. The sensing leg 104 includes two types of Magnetic Tunnel Junction (MTJ) elements. MTJs 108 and 110 include free layer magnetizations 112 and 114, respectively, oriented at 90 degrees with respect to respective fixed reference layers 116/118. As used herein, "0 degrees" is defined to be the orientation of the fixed reference layers for a particular bridge. The MTJs 108 and 110 are connected in series.

The sensing leg 104 also includes MTJs 128 and 130 which include free layer magnetizations 132 and 134, respectively, oriented at 270 degrees with respect to respective fixed reference layers 136/138. The MTJs 128 and 130 are connected in series. These two series pairs of MTJs 108/110 and 128/130 are connected together in a parallel configuration and the resultant conductance matches the conductance of a single device that is at a mid-point between the maximum and minimum conductance due to the orthogonal relationship of the free and pinned (fixed) layers at zero applied field.

The second leg is the reference leg 106 which is configured to provide a very weak response to an applied magnetic field sensed by the sensing leg 104. The reference leg 106 includes MTJs 148/150 with their free layer magnetization 152/154, respectively, aligned parallel (0 degrees, in the same direction of) to the respective fixed reference layers 156/158 and therefore at the maximum conductance state. The MTJs 148/150 are connected in series.

The reference leg 106 also includes MTJs 168/170 with their respective free layer magnetization 172/174 aligned antiparallel (180 degrees, in the opposite direction of) to the respective fixed reference layer 176/178 and therefore in the minimum conductance state. The MTJs 168/170 are connected in series.

These two series pairs of elements (148/150 and 168/170) are connected in a parallel configuration to match the total combined device conductance of a single device at the mid-point between the maximum and minimum conductance. This configuration matches the conductance of the sensing leg 104 at zero applied field and creates a balanced bridge with zero offset.

FIGS. 1 and 2 thus depict an MR magnetic field sensor system that includes three MR magnetic field sensor bridges 105 in the sensor 102 along with the control unit 101 and memory 103 in a smart phone. In other embodiments, the MR magnetic field sensor system is provided in other devices and as a stand-alone sensor. In some of the foregoing embodiments, fewer bridges are incorporated. Some embodiments include more than one type of MR magnetic field sensor. In some systems one or more of the control unit and memory are omitted.

The benefit of the TMR magnetic field sensor bridge 105 is its linearity and elimination of cross-axis effect for all TMR levels including advanced materials with very high TMR, like MgO barriers. In any magnetoresistive sensor, a cross-axis magnetic field (defined as a field applied along the non-sensitive direction) will change the sensitivity due to the influence of the field on the magnetic anisotropy. If the field is aligned to reinforce the magnetic anisotropy of the sensor, then the sensitivity will decrease. Conversely, if the cross-axis field opposes the anisotropy, the sensitivity is increased. This cross-axis effect causes a non-ideality that is difficult to correct with calibration. The unique configuration of the MTJ elements in this disclosure actually compensates the cross-axis effect due to the complimentary response of both the sense and reference legs. The sensitivity is independent of external magnetic field, regardless of applied direction.

Figure 3:
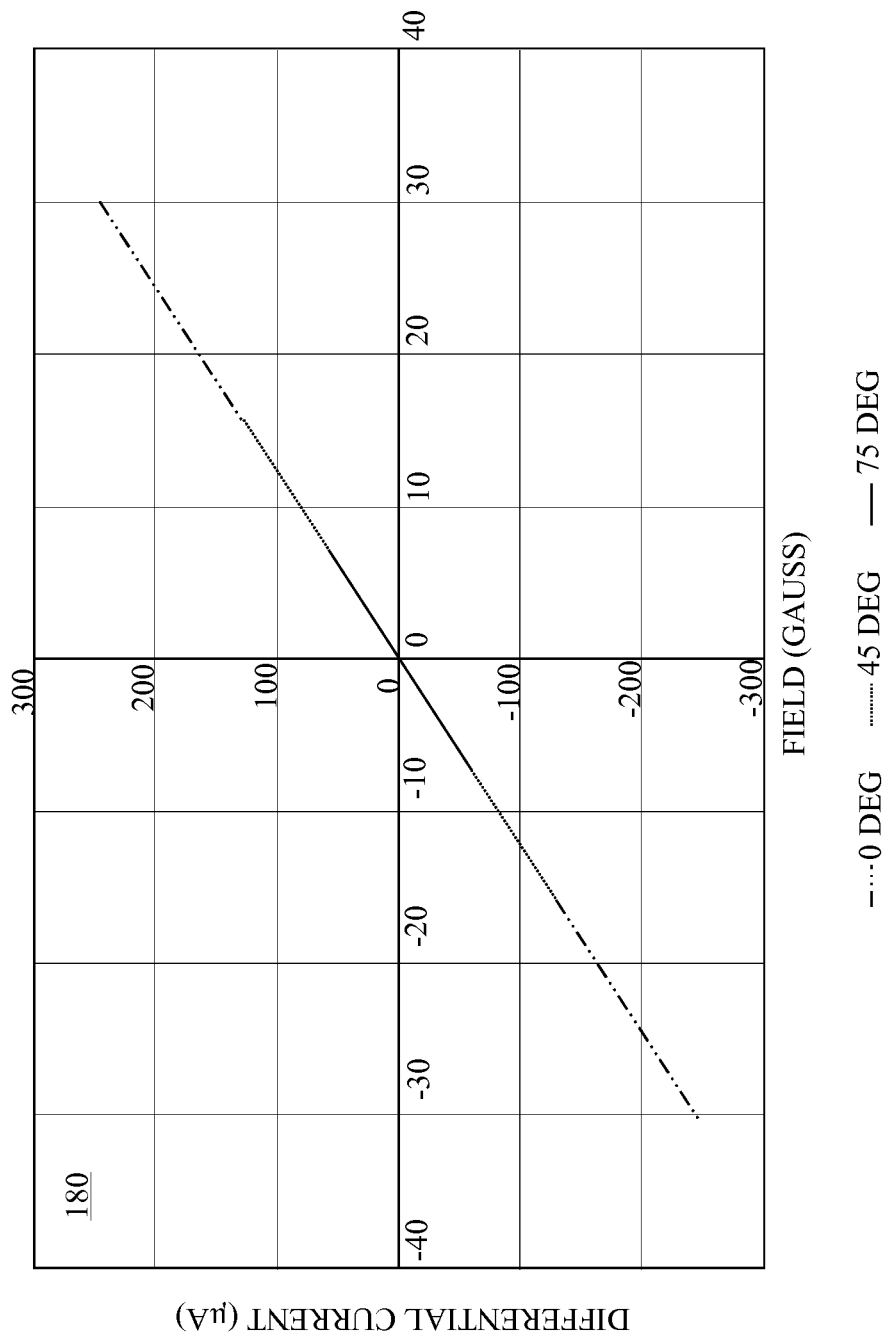
FIG. 3 depicts Matlab model results of the magnetization response of the free layer of the TMR magnetic field sensor bridge of FIG. 2 that was calculated using the ideal Stoner-Wohlfarth coherent rotation model.

The above configuration was verified in a Matlab model with the results provided in FIG. 3. The magnetization response of the free layer was calculated using the ideal Stoner-Wohlfarth coherent rotation model. As depicted in the graph 180 of FIG. 3, the output of the TMR magnetic field sensor bridge 105 from the Matlab model was linear with the slope (sensitivity) unchanged with applied field, regardless of angle. This indicates that the cross-axis effect was mitigated. This example is for a high TMR of 100%.

Figure 4:
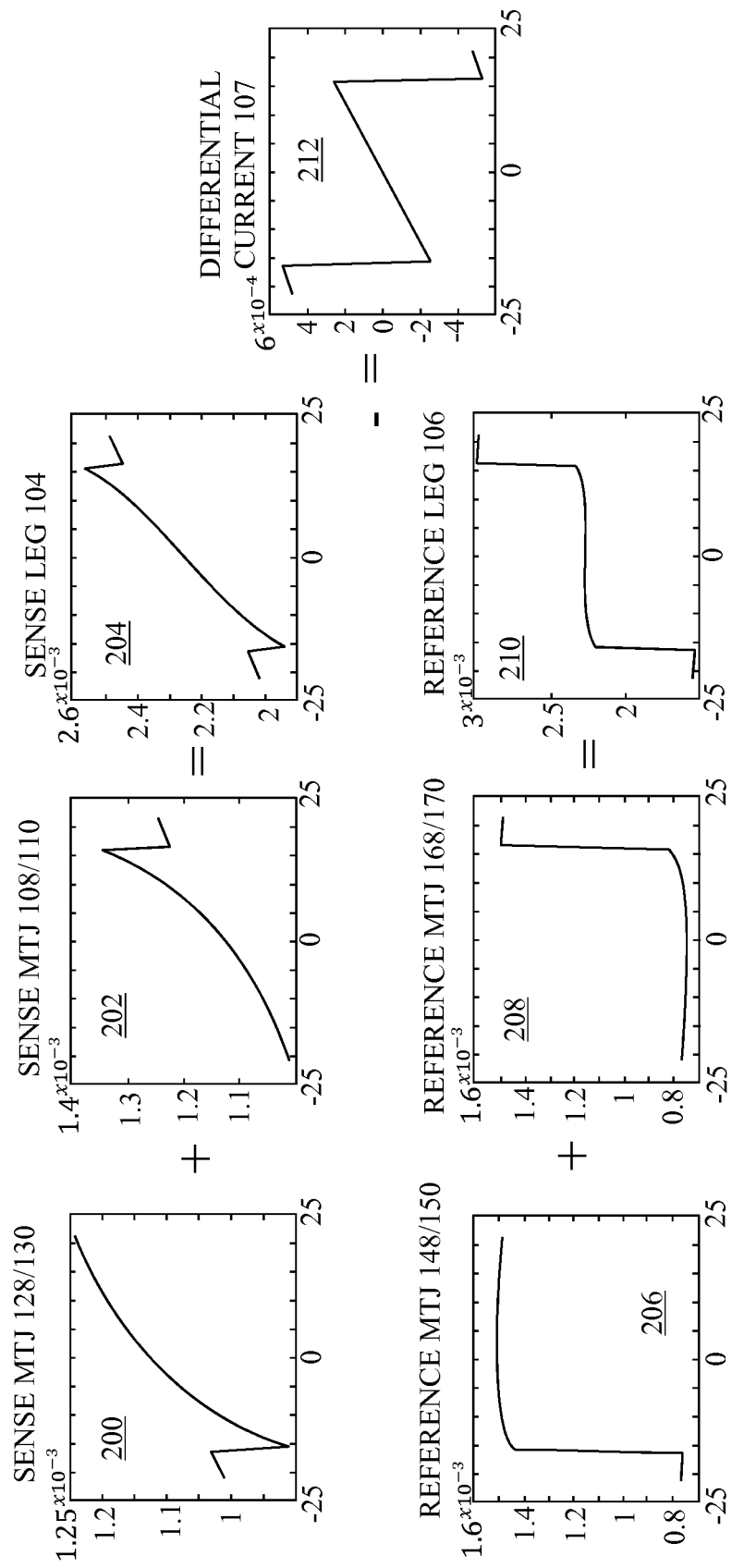
FIG. 4 depicts the current through various components of the TMR magnetic field sensor bridge of FIG. 2 which results from a magnetic field applied at a 45 degree angle, to show the compensation of a cross-axis effect by a reference leg response.

FIG. 4 depicts current through various components of the TMR magnetic field sensor bridge 105 which results from a magnetic field applied at a 45 degree angle, to show compensation of the cross-axis effect by a reference leg response. FIG. 4 thus depicts the individual component currents for the current through the MTJs 128/130 (graph 200), the MTJs 108/110 (graph 202), and the total current out of the sense leg 104 (graph 204). FIG. 4 further depicts the individual component currents for the current through the MTJs 148/150 (graph 206), the MTJs 168/170 (graph 208), and the total current out of the reference leg 106 (graph 210). Graph 212 depicts the differential current (ΔI) for the combined bridge output. The transitions in Graph 212 are the element switching fields at beyond sensor field range which in some embodiments is accounted for by execution of the program instructions by the control unit 101.

Figure 5:
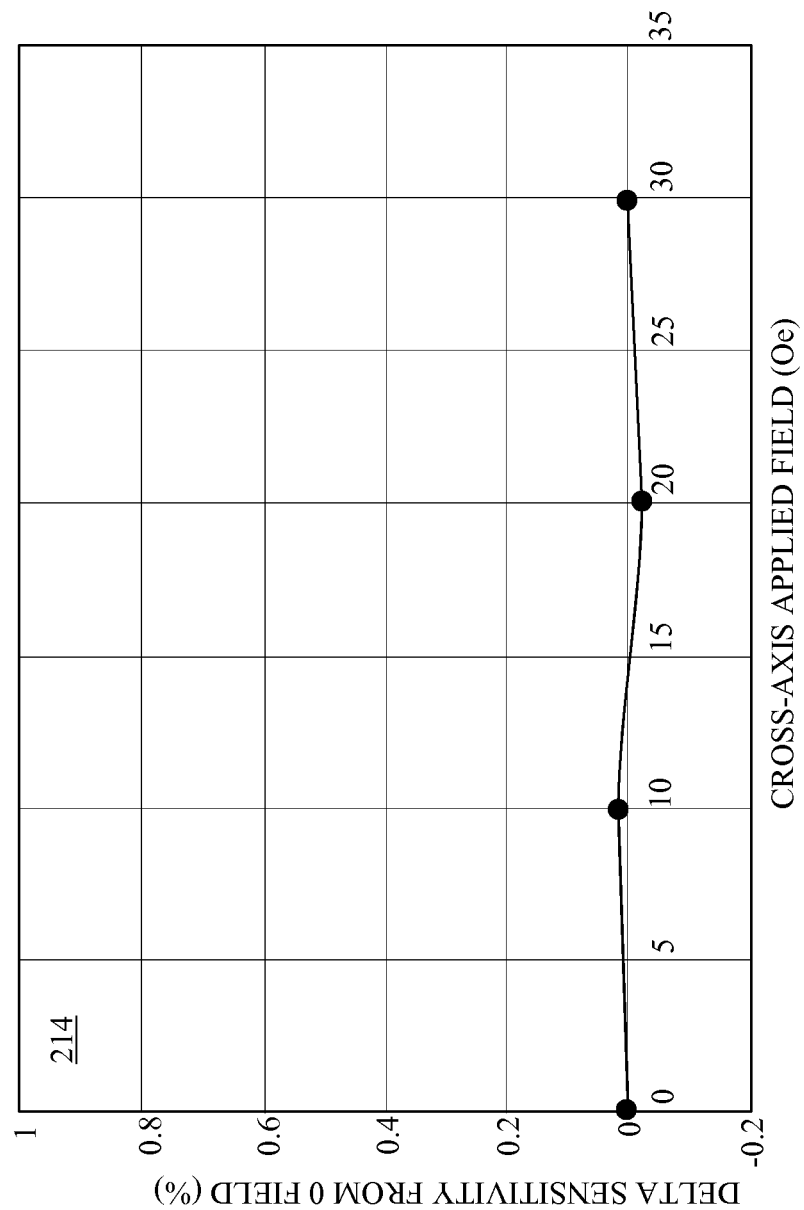
FIG. 5 depicts the cross-axis field impact on sensitivity for the TMR magnetic field sensor bridge of FIG. 2.

FIG. 5 depicts a graph 214 showing the cross-axis field impact on sensitivity for the TMR magnetic field sensor bridge 105. Variation is <<1% and only due to computational noise.

Figure 6:
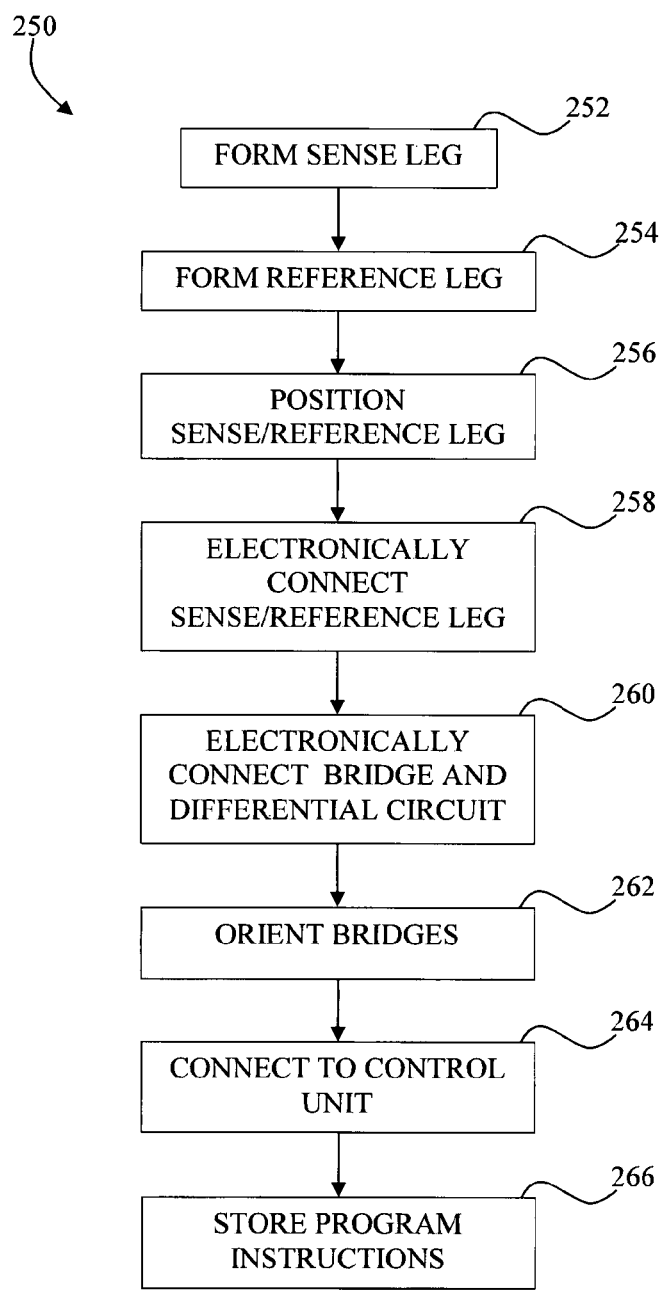
FIG. 6 depicts a schematic of a process that can be used to form the smartphone of FIG. 1.

An MR magnetic field sensor system in in one embodiment is formed in accordance with the method 250 of FIG. 6. At block 252 at least one sense leg such as the sense leg 104 of FIG. 2 is formed. Typically, a system will include three sense legs in three different bridges as discussed below to provide three axis sensing. Each sense leg includes at least one sense element with a first layer with a first fixed magnetization orientation and a second layer with a first free magnetization orientation, the first free magnetization orientation orthogonal to the first fixed magnetization orientation at a zero applied magnetic field. The sense elements may be provided and then arranged on a substrate such as a chip, or they may be formed on one or more chip. In one embodiment, each sense leg of each bridge is formed on a respective chip.

At least one reference leg is also formed (block 254). The reference leg(s) is formed with at least one reference element with a third layer with a second fixed magnetization orientation, and a fourth layer with a second free magnetization orientation. The magnetization orientations of the reference leg elements are parallel to one another. The reference leg in some embodiments is formed on the same chip as the associated sense leg.

At block 256 the associated sense and reference legs are positioned. In some embodiments, positioning of the sense and reference legs is substantially performed simultaneously with the formation of the sense and reference legs. In embodiments wherein the sense and reference legs are formed on different substrates, the sense substrate and reference leg substrate are typically positioned after forming the sense and reference legs. When positioning the sense and reference legs, the fixed magnetization layers of the sense and reference legs are positioned to be parallel to one another. Optimally, the sense and reference legs for a particular MR magnetic field sensor bridge are positioned immediately adjacent to each other.

The sense and reference legs are electronically connected at block 258. In connecting a sense leg with four sense elements and a reference leg with four reference elements, the electrical connections are formed as depicted in FIG. 2. The electrical connections in some embodiments are formed directly on or within the substrate(s) on which the sensor elements are formed. The electrical connections in some embodiments are formed in parallel with the formation of the sense elements. The bridge which is formed by the connection of the reference and sense legs in block 258 is further electronically coupled to a differential current sensing circuit (block 260).

In embodiments incorporating more than one bridge, the bridges are oriented at block 262. Typically, the fixed magnetization orientation of each bridge is oriented to be orthogonal to the fixed magnetization orientation of each of the other bridges. Back-up bridges would of course be oriented with their fixed magnetization orientation parallel to the primary bridge.

At block 264 the bridge or bridges are connected to a control unit. The control unit in some embodiments is a dedicated control unit for the bridge or bridges. In other embodiments, the control unit controls other components in a device such as a smartphone. In some embodiments, the differential current sensing circuit is provided in the control unit. Accordingly, block 260 in some embodiments is performed at the same time as block 264. The control unit is operably connected to a memory in which program instructions have been stored (block 266).

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A magnetoresistive (MR) magnetic field sensor system, comprising:
   at least one MR magnetic field sensor bridge, the at least one MF magnetic field sensor bridge including:
      a sense leg including at least one sense element with a first layer with a first fixed magnetization orientation and a second layer with a first free magnetization orientation, the first free magnetization orientation orthogonal to the first fixed magnetization orientation at a zero applied magnetic field, and
      a reference leg electronically connected in parallel to the sense leg, the reference leg including at least one reference element with a third layer with a second fixed magnetization orientation parallel to, and in the same direction as, the first fixed magnetization orientation, and a fourth layer with a second free magnetization orientation, the second free magnetization orientation parallel to the first fixed magnetization orientation at the zero applied magnetic field, wherein:
   the at least one sense element includes a first sense element and a second sense element;
   the first free magnetization orientation of the first sense element is opposite to the first free magnetization orientation of the second sense element at the zero applied magnetic field;
   the at least one reference element includes a first reference element and a second reference element; and
   the second free magnetization orientation of the first reference element is opposite to the second free magnetization orientation of the second reference element at the zero applied magnetic field.

2. The MR magnetic field sensor system of claim 1, wherein:
   the at least one sense element includes a third sense element and a fourth sense element;
   the third sense element is electronically connected in series to the first sense element;
   the fourth sense element is electronically connected in series with the second sense element;
   the first free magnetization orientation of the third sense element is opposite to the first free magnetization orientation of the fourth sense element at the zero applied magnetic field;
   the first free magnetization orientation of the third sense element is opposite to the first free magnetization orientation of the second sense element at the zero applied magnetic field;
   the at least one reference element includes a third reference element and a fourth reference element;
   the third reference element is electronically connected in series with the first reference element;

the fourth reference element is electronically connected in series with the second reference element;

the second free magnetization orientation of the third reference element is opposite to the second free magnetization orientation of the fourth reference element at the zero applied magnetic field; and the second free magnetization orientation of the third reference element is opposite to the second free magnetization orientation of the second reference element at the zero applied magnetic field.

3. The MR magnetic field sensor system of claim 2, further comprising:

a memory including program instructions stored therein; and a control unit operably connected to the at least one MR magnetic field sensor bridge and the memory, the control unit configured to execute the program instructions to determine a rotational orientation associated with the at least one MR magnetic field sensor bridge based upon input from the at least one MR magnetic field sensor bridge.

4. The MR magnetic field sensor system of claim 1, wherein:

the at least one MR magnetic field sensor bridge includes a first MR magnetic field sensor bridge and a second MR magnetic field sensor bridge; and the first fixed magnetization orientation of the first MR magnetic field sensor bridge is orthogonal to the first fixed magnetization orientation of the second MR magnetic field sensor bridge.

5. The MR magnetic field sensor system of claim 4, wherein:

the at least one MR magnetic field sensor bridge further includes a third MR magnetic field sensor bridge;

the first fixed magnetization orientation of the third MR magnetic field sensor bridge is orthogonal to the first fixed magnetization orientation of the first MR magnetic field sensor bridge; and the first fixed magnetization orientation of the third MR magnetic field sensor bridge is orthogonal to the first fixed magnetization orientation of the second MR magnetic field sensor bridge.

6. The MR magnetic field sensor system of claim 5, further comprising:

a memory including program instructions stored therein; and a control unit operably connected to the first MR magnetic field sensor bridge, the second MR magnetic field sensor bridge, the third MR magnetic field sensor bridge, and the memory, the control unit configured to execute the program instructions to determine a rotational orientation based upon input from the first MR magnetic field sensor bridge, the second MR magnetic field sensor bridge, and the third MR magnetic field sensor bridge.

7. The MR magnetic field sensor system of claim 1, wherein the at least one MR magnetic field sensor bridge is a tunneling MR magnetic field sensor bridge.

8. The MR magnetic field sensor system of claim 1, wherein the at least one MR magnetic field sensor bridge is an anisotropic MR magnetic field sensor bridge.

9. The MR magnetic field sensor system of claim 1, wherein the at least one MR magnetic field sensor bridge is a giant MR magnetic field sensor bridge.

10. A method of forming a magnetoresistive (MR) magnetic field sensor system, with at least one MR magnetic field sensor bridge, comprising:

forming a sense leg of the at least one MR magnetic field sensor bridge, the sense leg including at least one sense element with a first layer with a first fixed magnetization orientation and a second layer with a first free magnetization orientation, the first free magnetization orientation orthogonal to the first fixed magnetization orientation at a zero applied magnetic field, forming a reference leg of the at least one MR magnetic field sensor bridge, the reference leg including at least one reference element with a third layer with a second fixed magnetization orientation, and a fourth layer with a second free magnetization orientation;

positioning the reference leg with respect to the sense leg such that the second free magnetization orientation is parallel to the first fixed magnetization orientation at the zero applied magnetic field, and the second fixed magnetization orientation is parallel to, and in the same direction as, the first fixed magnetization orientation; and electronically connecting the sense leg in parallel to the reference leg, wherein forming the sense leg includes:

forming the sense leg with a first sense element and a second sense element; and positioning the first sense element and the second sense element such that the first free magnetization orientation of the first sense element is opposite to the first free magnetization orientation of the second sense element at the zero applied magnetic field, wherein forming the reference leg includes:

forming the reference leg with a first reference element and a second reference element; and positioning the first reference element and the second reference element such that the second free magnetization orientation of the first reference element is opposite to the second free magnetization orientation of the second reference element at the zero applied magnetic field.

11. The method of claim 10, wherein forming the sense leg includes:

forming the sense leg with a third sense element and a fourth sense element;

electronically connecting the third sense element in series with the first sense element;

electronically connecting the fourth sense element in series with the second sense element;

positioning the third sense element such that the first free magnetization orientation of the third sense element is opposite to the first free magnetization orientation of the fourth sense element at the zero applied magnetic field, and such that the first free magnetization orientation of the third sense element is opposite to the first free magnetization orientation of the second sense element at the zero applied magnetic field, wherein forming the reference leg includes:

forming the reference leg with a third reference element and a fourth reference element;

electronically connecting the third reference element in series with the first reference element;

electronically connecting the fourth reference element in series with the second reference element; and positioning the third reference element such that the second free magnetization orientation of the third reference element is opposite to the second free magnetization orientation of the fourth reference element at the zero applied magnetic field, and such that the second free magnetization orientation of the third reference element is opposite to the second free magnetization orientation of the second reference element at the zero applied magnetic field.

12. The method of claim 11, further comprising:
storing program instructions within a memory; and
operably connecting a control unit to the at least one MR magnetic field sensor bridge and the memory, the control unit configured to execute the program instructions to determine a rotational orientation associated with the at least one MR magnetic field sensor bridge based upon input from the at least one MR magnetic field sensor bridge.

13. The method of claim 10 wherein the at least one MR magnetic field sensor bridge includes a first MR magnetic field sensor bridge and a second MR magnetic field sensor bridge, the method further comprising:
positioning the first MR magnetic field sensor bridge and the second MR magnetic field sensor bridge such that the first fixed magnetization orientation of the first MR magnetic field sensor bridge is orthogonal to the first fixed magnetization orientation of the second MR magnetic field sensor bridge.

14. The method of claim 13, wherein the at least one MR magnetic field sensor bridge includes a third MR magnetic field sensor bridge, the method further comprising:
positioning the third MR magnetic field sensor bridge such that the first fixed magnetization orientation of the third MR magnetic field sensor bridge is orthogonal to the first fixed magnetization orientation of the first MR magnetic field sensor bridge, and orthogonal to the first fixed magnetization orientation of the second MR magnetic field sensor bridge.

15. The method of claim 14, further comprising:
storing program instructions in a memory; and
operably connecting a control unit to the first MR magnetic field sensor bridge, the second MR magnetic field sensor bridge, the third MR magnetic field sensor bridge, and the memory, the control unit configured to execute the program instructions to determine a rotational orientation based upon input from the first MR magnetic field sensor bridge, the second MR magnetic field sensor bridge, and the third MR magnetic field sensor bridge.

16. A magnetoresistive (MR) magnetic field sensor system, comprising:
at least one MR magnetic field sensor bridge, the at least one MF magnetic field sensor bridge including:
a sense leg including at least one sense element with a first layer with a first fixed magnetization orientation and a second layer with a first free magnetization orientation, the first free magnetization orientation orthogonal to the first fixed magnetization orientation at a zero applied magnetic field, and
a reference leg electronically connected in parallel to the sense leg, the reference leg including at least one reference element with a third layer with a second fixed magnetization orientation parallel to, and in the same direction as, the first fixed magnetization orientation, and a fourth layer with a second free magnetization orientation, the second free magnetization orientation parallel to the first fixed magnetization orientation at the zero applied magnetic field, wherein:
the at least one MR magnetic field sensor bridge includes a first MR magnetic field sensor bridge and a second MR magnetic field sensor bridge; and
the first fixed magnetization orientation of the first MR magnetic field sensor bridge is orthogonal to the first fixed magnetization orientation of the second MR magnetic field sensor bridge.

17. The MR magnetic field sensor system of claim 16, wherein:
the at least one MR magnetic field sensor bridge further includes a third MR magnetic field sensor bridge;
the first fixed magnetization orientation of the third MR magnetic field sensor bridge is orthogonal to the first fixed magnetization orientation of the first MR magnetic field sensor bridge; and
the first fixed magnetization orientation of the third MR magnetic field sensor bridge is orthogonal to the first fixed magnetization orientation of the second MR magnetic field sensor bridge.

18. The MR magnetic field sensor system of claim 17, further comprising:
a memory including program instructions stored therein; and
a control unit operably connected to the first MR magnetic field sensor bridge, the second MR magnetic field sensor bridge, the third MR magnetic field sensor bridge, and the memory, the control unit configured to execute the program instructions to determine a rotational orientation based upon input from the first MR magnetic field sensor bridge, the second MR magnetic field sensor bridge, and the third MR magnetic field sensor bridge.

* * * * *